(12) United States Patent
Simonnet

(10) Patent No.: US 6,921,930 B2
(45) Date of Patent: Jul. 26, 2005

(54) PULSE-CONTROLLED BISTABLE BIDIRECTIONAL ELECTRONIC SWITCH

(75) Inventor: Jean-Michel Simonnet, Veretz (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/182,541

(22) PCT Filed: Dec. 20, 2001

(86) PCT No.: PCT/FR01/04137
§ 371 (c)(1),
(2), (4) Date: Jul. 25, 2002

(87) PCT Pub. No.: WO02/50915
PCT Pub. Date: Jun. 27, 2002

(65) Prior Publication Data
US 2003/0001169 A1 Jan. 2, 2003

(30) Foreign Application Priority Data
Dec. 21, 2000 (FR) .......................................... 00 16836

(51) Int. Cl.[7] ........................ H01L 29/74; H01L 31/111
(52) U.S. Cl. ...................... 257/119; 257/127; 257/175; 257/107
(58) Field of Search ............................... 257/119, 127, 257/175, 107, 115

(56) References Cited

U.S. PATENT DOCUMENTS 4,939,564 A * 7/1990 Asakura et al. ............... 357/39
6,017,778 A 1/2000 Pezzani
6,034,381 A 3/2000 Pezzani
6,075,277 A 6/2000 Pezzani
6,373,319 B1 4/2002 Rault

FOREIGN PATENT DOCUMENTS

EP 0635889 A1 * 1/1995
EP 1061 650 A 12/2000

OTHER PUBLICATIONS

International Search Report from application No. PCT/FR01/04137 filed Dec. 20, 2001.
English translation of the International Preliminary Examination Report from priority application No. PCT/FR01/04137.

* cited by examiner

Primary Examiner—Jerome Jackson
Assistant Examiner—Joseph Nguyen
(74) Attorney, Agent, or Firm—Lisa K. Jorgenson; William R. McClellan; Wolf, Greenfield & Sacks, P.C.

(57) ABSTRACT

The invention concerns a bidirectional electronic switch of the pulse-controlled bistable type comprising a monolithic semiconductor circuit including a vertical bidirectional switch structure (TR; ACS) provided with a gate terminal (G1), first (Th1) and second (Th2) thyristor structures whereof the anodes are formed on the front face side, the first thyristor anode region containing a supplementary P-type region (6), and a metallization (A1, A2) connected to the main surface of the front face of the vertical bidirectional component and to the second thyristor anode; a capacitor (C) connected to the first thyristor anode and to the second thyristor supplementary N-type region; and a switch (SW) for short-circuiting the capacitor.

19 Claims, 3 Drawing Sheets

PULSE-CONTROLLED BISTABLE BIDIRECTIONAL ELECTRONIC SWITCH

BACKGROUND OF THE INVENTION

1. Field of the Invention

The present invention relates to a bistable bidirectional switch, that is, a switch capable of being turned on for several halfwaves of the A.C. voltage applied thereto, after a single control pulse. This bistable switch can then be turned off by application of a new pulse and remain off until it receives a new turn-on pulse.

2. Discussion of the Related Art

A first category of bidirectional switches is formed of switches of triac-type or other bidirectional switches corresponding to thyristor associations. A common feature of these components is that they are turned on in a given halfwave by a pulse, and then automatically turn off when the current flowing therethrough falls under a determined threshold, generally called the hold current $i_H$. Then, to turn such bidirectional switches back on, a pulse has to be applied again upon each halfwave during which the component is desired to be on. Thus, such switches are not bistable.

Another category of bidirectional switches is formed of components of MOS or bipolar transistor type, which turn on when a signal is applied to their control terminal, but for which this control signal must be continuously maintained for the component to remain on. Such components of transistor type are not controllable with pulses.

In prior art, it has been provided to associate semiconductor components and passive components in circuits enabling obtaining a pulse-controlled bistable bidirectional switch. However, such circuits are relatively complex and generally require association of several semiconductor components and of several passive components.

SUMMARY OF THE INVENTION

The present invention aims at the manufacturing in essentially monolithic form of such a pulse-controlled bistable bidirectional switch.

To achieve this and other objects, the present invention provides a bidirectional switch of pulse-controlled bistable type, including:

a monolithic semiconductor circuit formed from a lightly-doped N-type substrate having a rear surface coated with a metallization, including:

a vertical bidirectional switch structure provided with a gate terminal;

first and second thyristor structures, having respective anodes formed on respective front surface sides, the anode region of the first thyristor containing an additional P-type region;

a metallization connected to a main front surface of the vertical bidirectional component and to the anode of the second thyristor;

a capacitor connected to the anode of the first thyristor and to an additional N-type region of the second thyristor;

a switch for short-circuiting the capacitor.

According to an embodiment of the present invention, the monolithic semiconductor circuit includes an N-type substrate; and on a front surface side:

a first P-type region in which is formed a second N-type region corresponding to a first main electrode of the bidirectional switch, a second P-type region corresponding to an anode of the first thyristor, a third P-type region corresponding to an anode of the second thyristor and containing an additional N-type region;

on the rear surface side:

a P-type layer;

in this P-type layer, N-type regions, interrupted at locations where the bidirectional component includes an N-type region on its upper surface side.

According to an embodiment of the present invention, a gate contact is connected with the first P-type region and with an N-type region formed therein, the bidirectional switch structure being of triac type.

According to an embodiment of the present invention, the switch includes an isolating wall connecting the upper surface to the lower P-type surface and containing an N-type region on its upper surface side, with which a gate terminal is connected, the bidirectional switch structure being of ACS type.

According to an embodiment of the present invention, the rear surface electrode is connected to an A.C. voltage, the front surface electrode of the bidirectional switch structure being grounded.

According to an embodiment of the present invention, the front surface electrode is connected to an A.C. voltage, the front surface electrode of the bidirectional switch structure being grounded.

The foregoing and other objects, features and advantages of the present invention, will be discussed in detail in the following non-limiting description of specific embodiments in connection with the accompanying drawings, in which:

DETAILED DESCRIPTION

Figure 1:
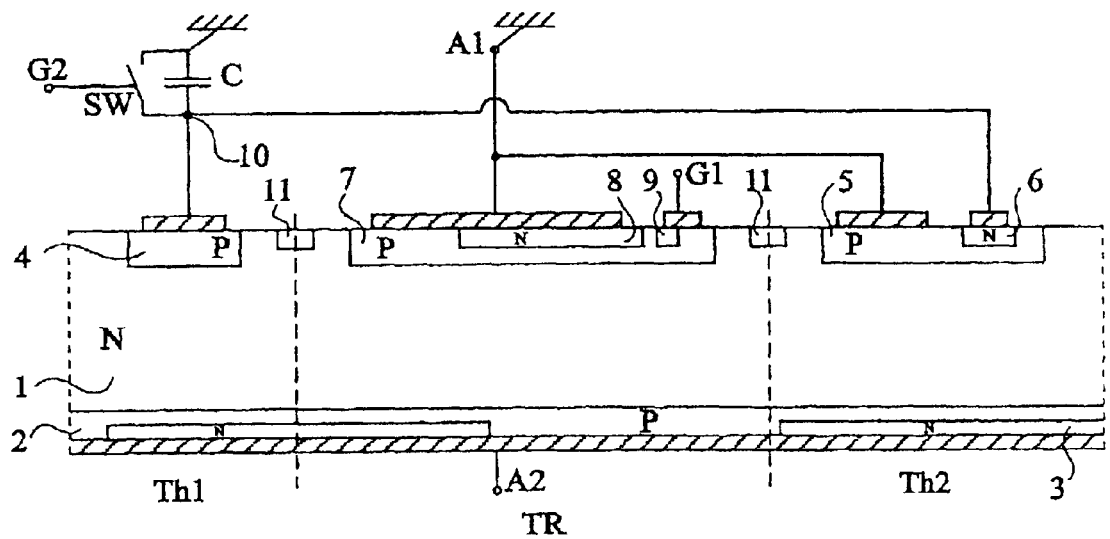
FIG. 1 is a simplified cross-section view of a first embodiment of a bistable bidirectional switch according to the present invention.

As illustrated in FIG. 1, a bistable bidirectional switch according to the present invention includes a monolithic semiconductor component or circuit formed from a semiconductor substrate 1 and a capacitor C.

The vertical semiconductor component includes a central portion corresponding to a vertical triac TR, a left-hand portion corresponding to a first vertical thyristor Th1, and a right-hand portion corresponding to a second vertical thyristor Th2.

The lower surface or rear surface of the monolithic semiconductor component is coated with a metallization which is connected to a terminal A2. This rear surface corresponds to a main electrode of the triac and to the cathodes of the first and second thyristors. The second main electrode A1 of the triac, the anodes of the first and second thyristors, and a gate terminal G1 of the triac are located on the front surface side. The anode of the first thyristor is connected to a terminal 10 of a capacitor C having its other terminal connected to ground. The second main electrode A1 of the triac is grounded. The first main electrode A2 is connected to an A.C. voltage, for example the mains at 50 or 60 Hz, via a load which is desired to be controlled. The triac gate is accessible from a terminal G1. The anode of thyristor Th2 is connected to terminal A1, that is, to ground. The anode region of thyristor Th2 contains an additional N-type region which is connected to terminal 10. A switch SW is connected in parallel with capacitor C. Switch SW is controllable from a terminal G2.

As indicated, the monolithic semiconductor component is formed from a substrate 1. This substrate is lightly doped of type N. On the rear surface side of the substrate are formed a P-type layer 2 and N-type regions 3. N-type regions 3 are conventionally absent in front of appropriate areas of triac TR and are present in front of anode region 4 of thyristor Th1 and of anode region 5 of thyristor Th2.

On the front surface side, the additional region formed in anode 5 of thyristor Th2 is designated with reference 6. The triac includes a P-type area 7 in which is formed an N-type region 8. Regions 7 and 8 and anode region 5 of thyristor Th2 are coated with a metallization connected to terminal A1. A metallization covers additional region 6 and is connected to terminal 10. Finally, a metallization covers anode region 4 and is also connected to terminal 10. Gate G1 is connected to a metallization which covers a portion of region 7 and an N-type region 9 formed therein.

Before explaining the operation of the device of FIG. 1, the conventional designations of the triggering modes of a bidirectional switch, for example, a triac, should be recalled. The triac is said to operate in one or the other of four quadrants Q1, Q2, Q3, Q4. A reference terminal, generally grounded, is chosen, and the biasings of the voltage on the other terminal, here terminal A2, and of the gate voltage on terminal G1, are considered. The triac is said to be triggered in first quadrant Q1 when the voltages on terminals A2 and G1 are positive with respect to terminal A1. In second quadrant Q2, the voltage on terminal A2 is positive and the voltage on terminal G1 is negative. In third quadrant Q3, the voltages on terminals A2 and G1 are negative. Finally, in fourth quadrant Q4, the voltage on terminal A2 is negative and the voltage on terminal G1 is positive.

The operation of the component of FIG. 1 after a pulse has been applied on gate terminal G1, to extract or insert a current in the gate, will now be studied.

It will first be considered that, at the time when the switch according to the present invention is controlled to turn on, electrode A2 is positive with respect to electrode A1. In this case, the applying of a voltage on terminal G1 triggers the triac in quadrant Q1 or Q2.

Figure 2:
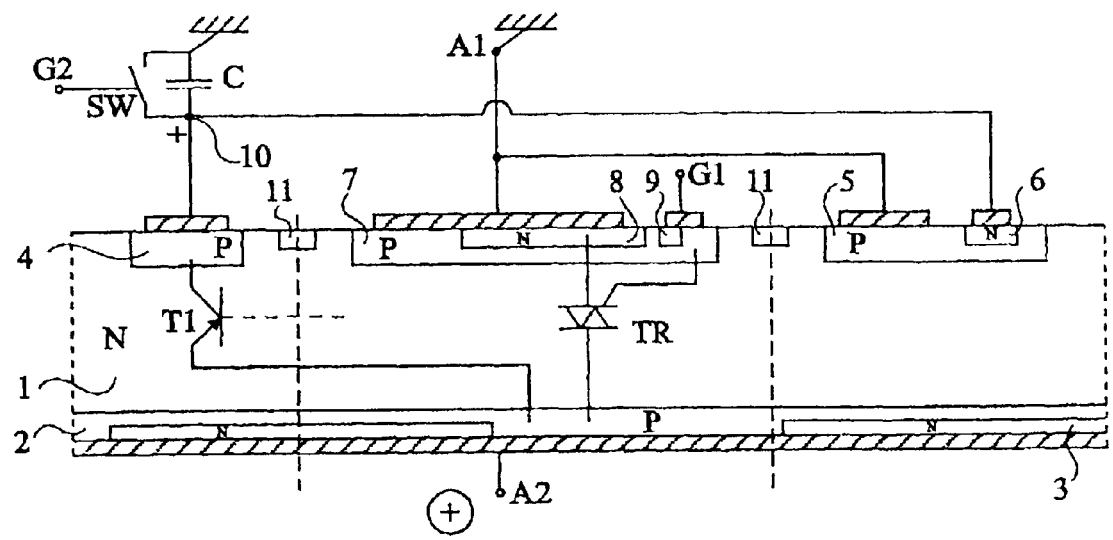
FIGS. 2 to 4 illustrate various operating phases of the bistable bidirectional switch of FIG. 1.

Then, as illustrated in FIG. 2, a current flows from terminal A2 to terminal A1 through triac TR. A current also flows from terminal A2 to terminal 10, via a PNP-type transistor T1 formed of P-type rear surface layer 2, N-type substrate 1 and P-type region 4. Capacitor C then charges to a voltage equal to the on-state voltage drop between terminals A2 and A1 minus the voltage drop at saturation (VCEsat) of transistor T1. As will be seen hereafter, the capacitor, during the on-state period of the triac in the considered halfwave, charges to a voltage level greater than 0.6 V. This level can be reached quite easily since the on-state voltage drop of a triac normally is on the order of 1.5 V while the saturation voltage of a PNP transistor normally is on the order of 0.3 V. The gain of the PNP transistor must however further be sufficient and the main current in the triac, which corresponds to the base current of the PNP transistor, must also be sufficient for the transistor to saturate. Further, the capacitance of capacitor C must be sufficient since, as will be seen hereafter, the charges accumulated in this capacitor will turn the triac on at the following halfwave. In a practical example, a capacitance on the order of 4.7 $\mu$F may be chosen for capacitor C. It should subsidiarily be noted that, during this operating phase in which terminal A2 is positive with respect to terminal A1, thyristors Th1 and Th2 are reverse-biased and are not on.

It should be noted that there also exists a responsive thyristor Th3 which includes, from its anode to its cathode, P-type layer 2 connected to terminal A2, N-type substrate 1, P-type region 5, and N-type region 6 (with no short-circuit holes). The cathode gate of this responsive thyristor corresponds to P-type region 5 and is grounded. Although this thyristor is properly biased between the anode and the cathode, it cannot turn on in this operating phase, its gate-cathode voltage being then negative or null (this gate-cathode voltage should be positive to turn thyristor Th3 on).

At the end of the positive halfwave, once the current in the triac becomes smaller than hold current $I_H$ of this triac, said triac tends not to be in a conductive state any more. However, terminal 10 is then more positive than terminal A1 and, given that charges are present in substrate 1, the lateral PNPN thyristor having as an anode P-type region 4 and as a cathode N-type region 8 connected to terminal A1 turns on. It can also be said that the current injected from terminal 10 maintains the current in triac TR above the value of hold current $I_H$ of this triac. Thus, at the end of the positive halfwave, there still exist charges in the substrate in the vicinity of the junction between this substrate and P-type region 7.

Figure 3:
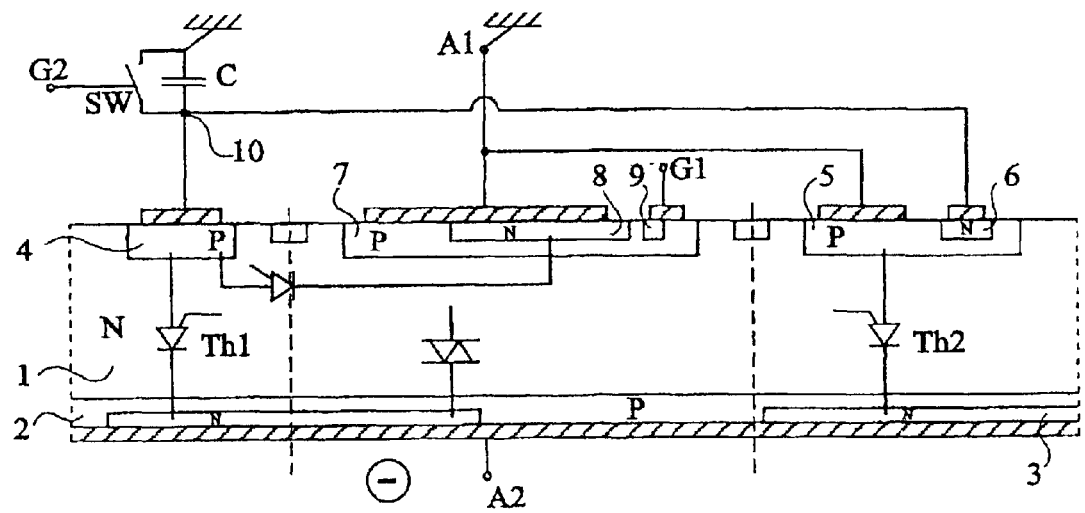

Accordingly, as illustrated in FIG. 3, when the voltage inverts on terminal A2 and this terminal becomes negative with respect to terminal A1, thyristors Th1 and Th2, which are biased in the on direction, and triac TR, switch on due to the remaining of charges in the substrate at the time of the voltage inversion. Terminal 10 of capacitor C then negatively charges via thyristor Th1, which blocks as soon as this charge reaches a level close to the on-state voltage drop of the triac. However, thyristor Th2 keeps on conducting and the current distributes between triac TR and thyristor Th2.

Figure 4:
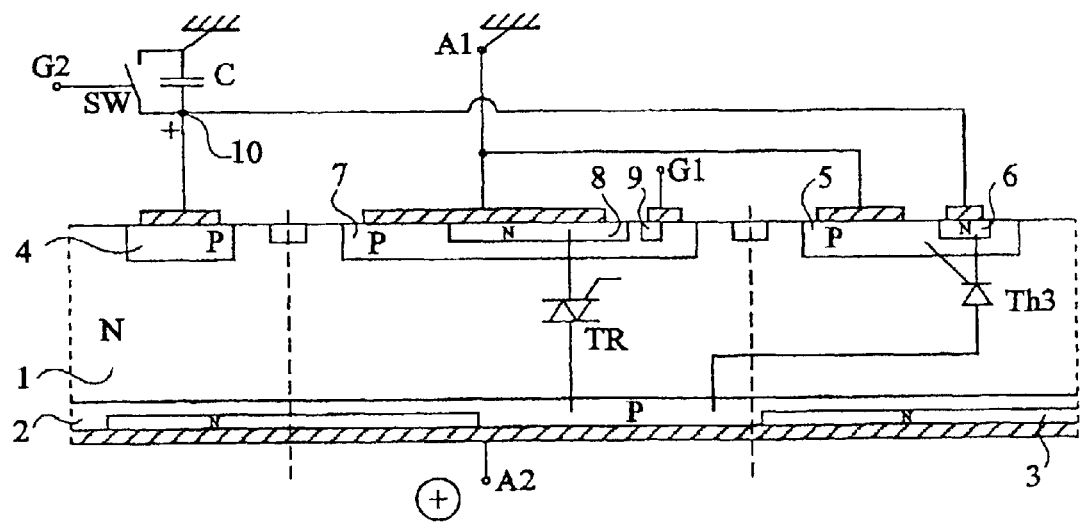

At the step illustrated in FIG. 4, it is assumed that the voltage on terminal A2 becomes positive again. As soon as the voltage on terminal A2 becomes sufficiently greater than the voltage on terminal A1, above-mentioned thyristor Th3 turns on, a gate current being generated by the discharge of capacitor C and flowing from P-type region 5 to N-type region 6. The turning-on of thyristor Th3 generates charges in the substrate and enables turning-on of triac TR. The situation existing at the step illustrated in FIG. 2 occurs again and capacitor C recharges again with a positive voltage on its terminal 10 to enable repeating the steps previously described in the progress of the successive halfwaves of the A.C. voltage applies to terminal A2.

It has thus been shown that the assembly of the semiconductor component shown in FIG. 1 and of capacitor C forms a bidirectional switch operating on A.C. current and that can be turned on by a pulse, and then indefinitely remain on under the effect of the charge and discharge of capacitor C.

To turn off this switch, capacitor C must be discharged to avoid for it to turn triac TR back on at the next halfwave. A switch SW controlled by a control terminal G2 in parallel on capacitor C has been shown in FIG. 1 as an example. Preferably, a discharge resistor will be arranged in series with switch SW. Thus, as soon as a turn-off pulse is applied on terminal G2, capacitor C discharges and the triac turns off at the end of the current halfwave. The device can operate with a mere pulse control on terminal G2, this pulse preferably having a non-negligible duration as compared to the duration of a halfwave. However, preferably, switch SW will be maintained off as long as triac TR is not desired to be turned back on, to avoid triggering of this triac under the effect of an unwanted pulse on terminal G1. Indeed, in the presence of an unwanted pulse, the triac could turn on and remain on under the effect of capacitor C which is not short-circuited. It should be clear for those skilled in the art that, if a device in which switch SW remains off during the off-state phases of the triac is chosen, switch SW should be immediately turned off immediately before applying a pulse on terminal G1 when a turn-on phase is desired to be initiated. It should however be noted that switch SW can be left on if triac TR is desired to be conventionally operated under the sole effect of a control by gate G1.

The device according to the present invention can also operate in full-period control. If the portion of the semiconductor shown in FIG. 1 corresponding to thyristor Th2 is eliminated, when the triac is started in the first or in the second quadrant, while terminal A2 is positive with respect to terminal A1, a single control pulse at the beginning of a positive halfwave will turn triac TR on for the entire positive halfwave. Then, the conduction will carry on during the following negative halfwave under the effect of the discharge of capacitor C, after which the triac will turn off.

Those skilled in the art should understand that the component of FIG. 1 could also be modified so that it remains on for a complete period after a turning-on on a negative halfwave. For this purpose, one could, for example, roughly keeping the structure of FIG. 1, reduce the surface area of P-type region 4 forming the anode of thyristor Th1. Thus, transistor T1 (see Fig. 2) does not enable sufficient charging of capacitor C in a positive halfwave but thyristor Th1 can do it during a negative halfwave.

The turn-on control of the switch according to the present invention in a quadrant Q1 or Q2, that is, at the time when terminal A2 is positive with respect to terminal A1, has previously been described. In a quadrant Q3 or Q4, that is, at a time when terminal A2 is negative with respect to terminal A1, the system actually amounts to that described in relation with FIG. 3. The initial starting is caused by the action on gate G1 and, then, thyristors Th1 and Th2 turn on and capacitor C charges to initiate an operation which continues as previously described.

According to an advantage of the present invention, the state (on or off) of the switch according to the present invention can be determined at any time. It is enough to measure the voltage across the capacitor. If, during a period (20 ms), this voltage exceeds a value of 0.2 V, the switch is known to be on. A comparison with a ±0.2 V threshold could also be performed every 10 ms. These values of 20 and 10 ms are given in the case of a periodic voltage of the 50-hertz mains. These values will be changed as appropriate if the A.C. voltage applied to the switch according to the present invention is at a frequency other than 50 hertz, for example, if it is a 60-hertz voltage.

The present invention is likely to have various alterations, modifications, and improvements which will occur to those skilled in the art. In particular, switch SW may be integrated in an isolated portion of substrate 1. It should be noted that this switch may be a low-voltage switch since capacitor C sees across its terminals at most a voltage on the order of from 1 to 3 V. Thus, it is particularly simple to associate with the capacitor an easily assembled low-cost low-voltage switch.

According to an advantage of the present invention, gates G1 and G2 may both be grounded. The control signals on these gates are referenced with respect to the ground and thus are easily-implemented low-voltage signals.

The switch according to the present invention is easy to use since it can be started in any operating phase and in any of quadrants Q1 to Q4. Similarly, the turning-off can be performed at any time.

The component may be adapted to specific requirements by optimizing PNP transistor T1 (FIG. 2).

N-type regions 11 arranged on the upper surface side between the various P-type regions have been shown in FIG. 1. These N-type regions are optional and have the usual function of channel stop regions intended for avoiding the occurrence of surface leakage currents.

On the other hand, the power triac surface area can be reduced, since auxiliary thyristor Th2 completes the operation of this triac in one of its operating biasings (terminal A2 negative with respect to terminal A1).

According to an alternative of the present invention, a bidirectional switch other than a triac may be used, for example a bidirectional component having its reference electrode with respect to which the gate is controlled corresponding to the rear surface metallization. Such a component, which will be referred to as ACS (trade name registered by STMicroelectronics Company) is especially described in US patent application Ser. No. 6,034,381 (B3073), which is incorporated herein by reference.

Figure 5:
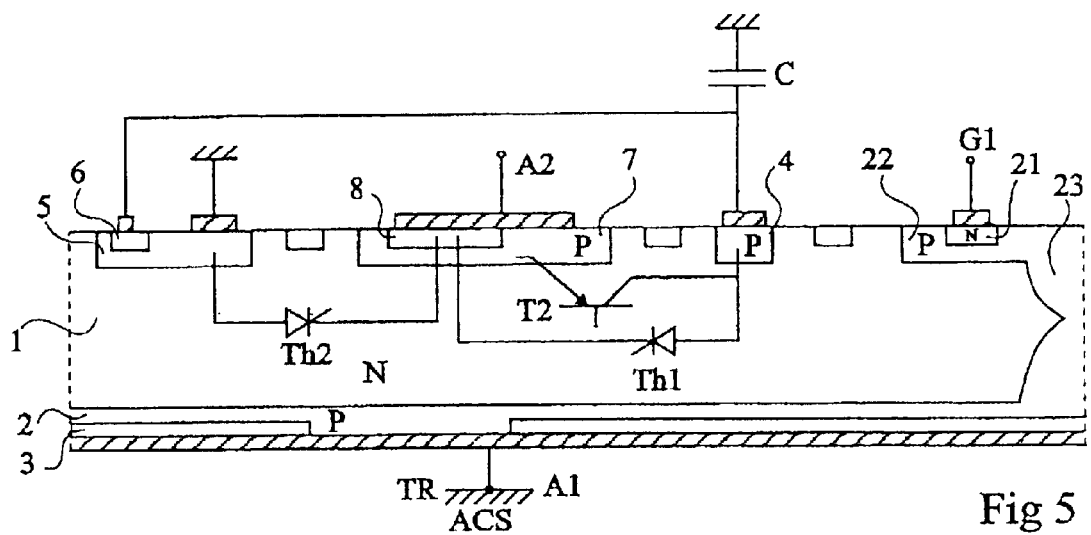
FIG. 5 is a simplified cross-section view of a second embodiment of a bistable bidirectional switch according to the present invention.

The application of the present invention to such a component is illustrated in FIG. 5 which shows the elements of a vertical bidirectional ACS component between terminals A1 and A2 at the center of the drawing. Thyristor Th1 includes, from its anode to its cathode, P-type region 4, substrate 1, P-type region 7, and N-type region 8. Thyristor Th2 includes, from its anode to its cathode, P-type region 5, substrate 1, P-type region 7, and N-type region 8. On either side of this component or more generally next to this component are formed lateral thyristors Th1 and Th2. This time, A1 designates the main rear surface terminal, which is grounded, and A2 designates the main front surface terminal, which is connected to an A.C. voltage via a load. The starting of the vertical bidirectional component is ensured by an electrode G1 connected to an N-type region 21 formed in a P-type extension 22 of an isolating wall 23 crossing the semiconductor wafer and in continuity with rear surface P-type layer 2. As previously, a capacitor C keeps the component in the on-state upon each bias switching after the initial turning-on of the vertical component. A terminal of capacitor C is grounded. The other terminal of capacitor C is connected to the anode of thyristor Th1 and to N-type region 6 formed in anode layer 5 of thyristor Th2. Those skilled in the art should understand that the operation of this system is similar to what has previously been described. Thyristors Th1 and Th2 now are lateral thyristors. The equivalent of vertical PNP transistor T1 shown in FIG. 2 is a horizontal PNP transistor T2, the emitter of which corresponds to P-type region 7 of the vertical bidirectional component, the base of which corresponds to N-type substrate 1, and the collector of which corresponds to P-type anode region 4 of lateral thyristor Th1.

To determine the on or off state of the bidirectional switch of FIG. 5, it can as in the preceding case be determined whether capacitor C is charged or not during a halfwave or a period of the applied A.C. signal. In this case, a detection element may also be provided on the other side of an isolating wall which is crossed by carriers when a significant current is conducted by the power component as described in U.S. patent application Ser. No. 09/705,113 (B4438), which is incorporated herein by reference.

Figure 6:
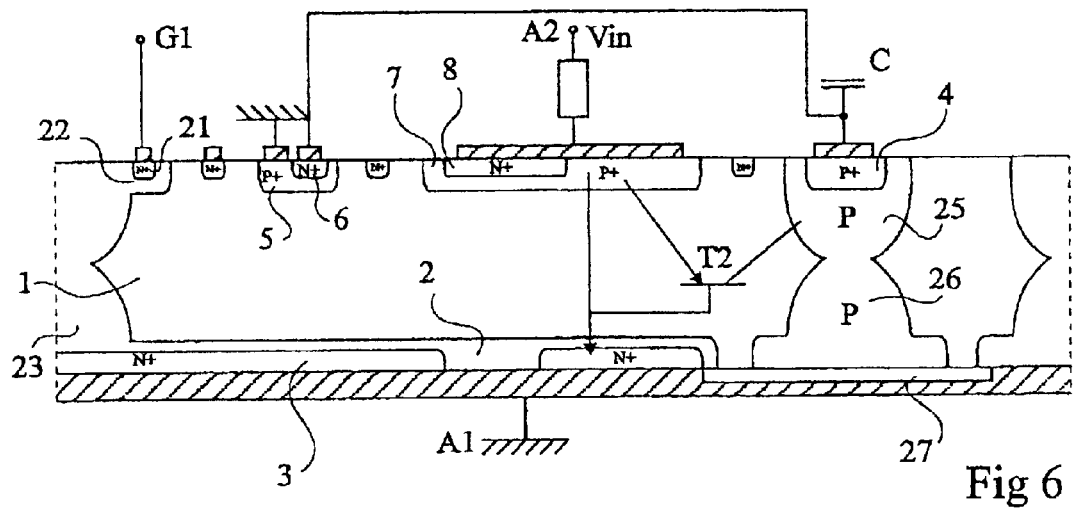
FIGS. 6 and 7 are simplified cross-section views of alternatives to the second embodiment of the present invention.
Figure 7:
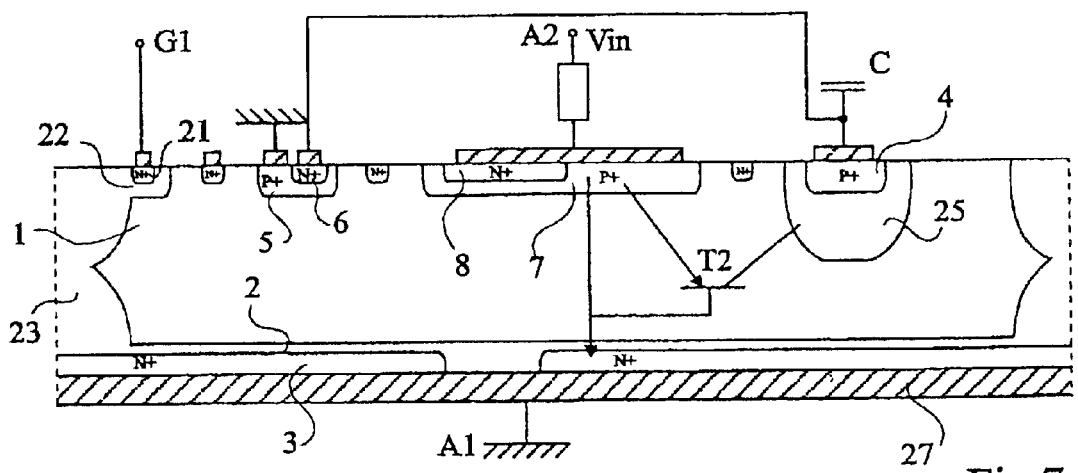

FIGS. 6 and 7 show alternative embodiments of the device of FIG. 5. These alternatives essentially consist in modifications of the collector region of transistor T2 (anode region of thyristor Th1). In both cases, this anode region is extended by a P-type drive-in to increase the transistor gain.

In the case of FIG. 6, this drive-in region is designated by reference 25 and joins a drive-in 26 also of type P formed from the lower surface. The lower portion of drive-in 26 is covered with an oxide layer 27 to isolate P-type regions 4 25–26 from electrode A1, which is grounded.

In the case of FIG. 7, only drive-in 25 is formed.

Further, FIGS. 6 and 7 show various detail alternatives with respect to the representation of FIG. 5. Especially, gate area G1 has been shown on the left-hand of the drawing rather than on the right-hand side to simplify the representation.

The present invention is likely to have various other alternatives and modifications which will readily occur to those skilled in the art, especially as concerns modifications of the main vertical bidirectional power component and alternative embodiments of auxiliary elements Th1 and Th2.

The bistable bidirectional component according to the present invention could be formed individually in a silicon wafer or belong to a general structure incorporating other components of the same type, as described for example in U.S. Pat. No. 6,075,277 (B2578), which is incorporated herein by reference.

What is claimed is:

1. A bidirectional switch of pulse-controlled bistable type, including:
   a monolithic semiconductor circuit formed from a lightly-doped N-type substrate having a rear surface side coated with a metallization, including:
   a vertical bidirectional switch structure provided with a gate terminal;
   first and second thyristor structures having respective anodes formed on a front surface side, the anode region of the second thyristor containing an additional N-type region;
   a metallization connected to a main front surface of the vertical bidirectional switch structure and to the anode of the second thyristor;
   a capacitor connected to the anode of the first thyristor and to the additional N-type region of the second thyristor; and
   a switch for short-circuiting the capacitor.

2. The electronic switch of claim 1, wherein the monolithic semiconductor circuit includes
   on the front surface side:
   a first P-type region in which is formed a second N-type region corresponding to a first main electrode of the bidirectional switch structure,
   a second P-type region corresponding to an anode of the first thyristor,
   a third P-type region corresponding to an anode of the second thyristor and containing the additional N-type region;
   on the rear surface side:
   a P-type layer;
   in this P-type layer, N-type regions, interrupted at locations where the bidirectional switch structure includes an N-type region on its front surface side.

3. The switch of claim 2, wherein a gate contact is connected with the first P-type region and to an N-type region formed therein, the bidirectional switch structure being of triac type.

4. The switch of claim 2, including an isolating wall connecting the upper surface to the P-type layer and containing an N-type region on its upper surface side, with which the gate terminal is connected, the bidirectional switch structure being of ACS type.

5. The switch of claim 3, wherein the rear surface metallization is connected to an A.C. voltage, the front surface metallization of the bidirectional switch structure being grounded.

6. The switch of claim 4, wherein the front surface metallization is connected to an A.C. voltage, the rear surface metallization of the bidirectional switch structure being grounded.

7. A bidirectional switch comprising:
   a lightly-doped substrate having a metallization on its rear surface;
   a vertical bidirectional component provided with a gate terminal;
   first and second thyristors having anodes formed in a front surface of the substrate, an anode region of the second thyristor having an additional region of opposite conductivity;
   a metallization connected to a front surface of the vertical bidirectional component and to the anode of the second thyristor;
   a capacitor connected to the anode of the first thyristor and to the additional region of the second thyristor; and
   a device for controlling charging of the capacitor.

8. A bidirectional switch as defined in claim 7, wherein the lightly-doped substrate is an N-type substrate.

9. A bidirectional switch as defined in claim 8, wherein the additional region of the second thyristor is an N-type region.

10. A bidirectional switch as defined in claim 7, wherein the bidirectional component is a triac.

11. A bidirectional switch as defined in claim 7, wherein the bidirectional component is an ACS.

12. A bidirectional switch as defined in claim 9, including:
    on a front surface side of the substrate, a first P-type region in which is formed a second N-type region corresponding to a first main electrode of the bidirectional component, a second P-type region corresponding to an anode of the first thyristor, and a third P-type region corresponding to an anode of the second thyristor and containing the additional N-type region; and
    on the rear surface side of the substrate, a P-type layer, and in the P-type layer, N-type regions, interrupted at locations where the bidirectional component includes an N-type region on its upper surface side.

13. A bidirectional switch as defined in claim 12, wherein a gate contact is connected to the first P-type region and to an N-type region formed therein, the bidirectional component being of triac type.

14. A bidirectional switch as defined in claim 12, including an isolating wall connecting the upper surface to the P-type layer and containing an N-type region on its upper surface side, to which the gate terminal is connected, the bidirectional component being of ACS type.

15. A bidirectional switch as defined in claim 13, wherein the rear surface metallization is connected to an AC voltage, the front surface metallization of the bidirectional component being grounded.

16. A bidirectional switch as defined in claim 14, wherein the front surface metallization is connected to an AC voltage, the rear surface metallization of the bidirectional component being grounded.

17. A bidirectional switch as defined in claim 7, wherein the device for controlling charging of the capacitor comprises an electronically controllable switch.

18. A bidirectional switch as defined in claim 7, wherein the vertical bidirectional component is configured for four quadrant operation.

19. A method for controlling a bidirectional switch, comprising:

providing a lightly-doped substrate having a metallization on its rear surface;

providing in the substrate a vertical bidirectional component having a gate terminal;

providing in the substrate first and second thyristors having anodes formed on a front surface of the substrate, an anode region of the second thyristor having an additional region of opposite conductivity;

connecting the front surface of the vertical bidirectional component and the anode of the second thyristor;

connecting a capacitor to the anode of the first thyristor and to the additional region of the second thyristor; and controlling charging of the capacitor.

* * * * *

UNITED STATES PATENT AND TRADEMARK OFFICE
CERTIFICATE OF CORRECTION

PATENT NO. : 6,921,930 B2 Page 1 of 1
APPLICATION NO. : 10/182541
DATED : July 26, 2005
INVENTOR(S) : Jean-Michel Simonnet It is certified that error appears in the above-identified patent and that said Letters Patent is hereby corrected as shown below:

On the title page, item [57]: in the Abstract, line 8 should read:
--N-type region (6), and a metallization (A1, A2) connected to--

Signed and Sealed this

Tenth Day of October, 2006

JON W. DUDAS
*Director of the United States Patent and Trademark Office*